(12) United States Patent
Duperray

(10) Patent No.: US 7,058,139 B2
(45) Date of Patent: Jun. 6, 2006

(54) TRANSMITTER WITH TRANSMITTER CHAIN PHASE ADJUSTMENT ON THE BASIS OF PRE-STORED PHASE INFORMATION

(75) Inventor: David Benoit Didier Duperray, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 744 days.

(21) Appl. No.: 09/993,985

(22) Filed: Nov. 16, 2001

(65) Prior Publication Data

US 2003/0095608 A1   May 22, 2003

(51) Int. Cl.
 H04K 1/02 (2006.01)
 H04L 25/03 (2006.01)
 H04L 25/49 (2006.01)

(52) U.S. Cl. ...................................... 375/297
(58) Field of Classification Search ................ 375/297, 375/295, 296
 See application file for complete search history.

(56) References Cited

U.S. PATENT DOCUMENTS

| 4,194,200 | A | * | 3/1980 | Goldie ......................... 342/92 |
| 4,291,277 | A | * | 9/1981 | Davis et al. .................. 330/149 |
| 5,123,031 | A | * | 6/1992 | Kuisma ........................ 375/296 |
| 5,202,906 | A | * | 4/1993 | Saito et al. ................... 331/14 |
| 5,220,557 | A | * | 6/1993 | Kelley ......................... 370/345 |
| 5,396,217 | A | * | 3/1995 | Proefke et al. ........ 340/426.26 |
| 5,579,346 | A | * | 11/1996 | Kanzaki ....................... 375/344 |
| 5,892,774 | A | | 4/1999 | Zehavi et al. |
| 6,046,649 | A | | 4/2000 | Lange |
| 6,246,286 | B1 | * | 6/2001 | Persson ....................... 330/149 |
| 6,275,103 | B1 | * | 8/2001 | Maniwa ....................... 330/149 |
| 6,288,610 | B1 | * | 9/2001 | Miyashita .................... 330/149 |
| 6,295,442 | B1 | * | 9/2001 | Camp et al. ................. 455/102 |
| 6,304,140 | B1 | * | 10/2001 | Thron et al. ................. 330/149 |
| 6,404,823 | B1 | * | 6/2002 | Grange et al. ............... 375/297 |
| 6,489,844 | B1 | * | 12/2002 | Yamashita et al. ............ 330/52 |
| 6,539,052 | B1 | * | 3/2003 | Hessel et al. ................ 375/225 |
| 6,614,854 | B1 | * | 9/2003 | Chow et al. ................. 375/297 |
| 6,721,370 | B1 | * | 4/2004 | Kurihara ...................... 375/297 |
| 6,831,954 | B1 | * | 12/2004 | Mandyam .................... 375/286 |
| 6,853,690 | B1 | * | 2/2005 | Sorrells et al. .............. 375/295 |
| 2002/0061050 | A1 | * | 5/2002 | Ozluturk et al. ............. 375/141 |
| 2004/0037364 | A1 | * | 2/2004 | Gagey et al. ................ 375/261 |

FOREIGN PATENT DOCUMENTS

| EP | 0967717 A2 | 5/1999 |
| GB | 2348062 A | 3/2000 |
| WO | WO0072438 | 5/1999 |
| WO | WO0059174 | 3/2000 |

* cited by examiner

Primary Examiner—Stephen Chin
Assistant Examiner—Jia Lu

(57) ABSTRACT

A transmitter chain has a quadrature modulator, a variable gain amplifier, an up-converter, and a variable gain power amplifier. An overall phase of the transmitter chain is adjusted on the basis of pre-stored phase information reflecting phase changes due to simultaneous gain changes of gains of at least the variable gain amplifier and the variable gain power amplifier.

20 Claims, 3 Drawing Sheets

TRANSMITTER WITH TRANSMITTER CHAIN PHASE ADJUSTMENT ON THE BASIS OF PRE-STORED PHASE INFORMATION

BACKGROUND OF THE INVENTION

1. Field of the Invention

The present invention relates to a transmitter, more particularly to phase adjustment of a transmitter chain comprising a quadrature modulator, a variable gain amplifier, an up-converter, and a variable gain power amplifier.

The present invention further relates to a phase adjuster, to a method of adjusting an overall phase of a transmitter chain, and to a communication device with a phase adjuster in a transmitter chain.

Such a transmitter can be a transmitter in a full-duplex direct sequence spread-spectrum CDMA system, or any other suitable system with a high dynamic range transmitter output signal.

2. Description of the Related Art

Full-duplex CDMA systems are known in which transmitters have a high dynamic range output signal, typically a dynamic range of more than 70 dB. Newer CDMA systems, but also other systems, are referred to as linear modulation systems in which information is carried on amplitude as well as on phase. In such systems non-linear amplifiers cannot be adopted because the amplitude of a modulated signal varies within a wide range, i.e., the modulated peak signal envelope exhibits large fluctuations. Therefore, amplifiers in a transmitter chain need to be very linear. Particularly for a variable gain power amplifier that amplifies an up-converted signal of high frequency, e.g. in a GHZ band, meeting linearity requirements over a wide range is not easy. Typically, such variable gain power amplifiers are optimized in efficiency at maximum signal output but have poor efficiency at low signal output.

SUMMARY OF THE INVENTION

It is an object of the invention to provide a transmitter with a phase adjuster in a transmitter chain that adjusts an overall phase of the transmitter chain thereby at least taking into account simultaneous gain changes of gains of a variable gain amplifier and a variable gain power amplifier.

It is a further object of the invention to provide such phase adjustment that largely uses a priori information of characteristics of such a transmitter chain, such as its phase and gain characteristics.

In accordance with the invention, a transmitter is provided comprising:

a quadrature modulator for providing a quadrature modulated signal from a pair of quadrature base band signals;

a variable gain amplifier for providing an amplified quadrature modulated signal;

an up-converter for up-converting said amplified quadrature modulated signal to a higher frequency signal;

a variable gain power amplifier for providing an amplified higher frequency signal from said higher frequency signal, said amplified higher frequency signal comprising amplitude and phase information; and phase adjusting means for adjusting an overall phase of a transmitter chain including said quadrature modulator, said variable gain amplifier, said up-converter, and said variable gain power amplifier, said overall phase being adjusted on the basis of pre-stored phase information reflecting phase changes due to simultaneous gain changes of gains of at least said variable gain amplifier and said variable gain power amplifier.

The invention is based on the recognition of the need to make a phase adjustment in the transmitter chain when improving the overall transmitter efficiency by decreasing the gain of the variable gain power amplifier that operates at an radio frequency, and thereby simultaneously increasing the gain of the variable gain amplifier that operates at an intermediate frequency. The invention is further based on the recognition to make such a phase adjustment even when the total gain of the transmitter chain remains constant from one gain state to another gain state. The invention is further based on the recognition that usually no full phase compensation is need because transmitters work according to standards that allow predetermined maximum phase variations over the dynamic range of the signal and with frequency. In this respect, phase variations should not be too large because, when transmitting from a portable communication device to base station of a system, such phase variations could lead to a poor bit error rate at the base stations, and, eventually, a call drop. Based on these recognitions, the inventor had considered that overall phase adjustment on the basis of pre-stored information was feasible where others may have thought such an overall phase adjustment might be impractical or even impossible to practically implement.

In an embodiment the pre-stored information is stored in a look-up table, and, upon a gain state change of the variable gain power amplifier, from corresponding entries in the look-up table information is used to determine the gain of the variable gain amplifier, and the phase adjustment value.

In an embodiment, the overall phase of the transmitter chain is adjusted by phase rotating quadrature base band signals prior to modulation. At constant gain of the transmitter chain, such a phase adjustment effectively rotates the so-called IQ-constellation. Rotation of the IQ-constellation as such is known in the art, for instance from the U.S. Pat. No. 5,892,774 the contents of which is herewith incorporated by reference. More particularly, in U.S. Pat. No. 5,982,774 phase rotation is shown in FIG. 3 thereof and described in column 6, lines 30–40 where it is disclosed that a phase encoder rotates an $(X_I, X_Q)$ pair by an angle $\phi_n[k]$ to produce a signal $(Y_I, Y_Q)$ at its output.

In various embodiments, the transmitter may include a temperature sensor, a battery voltage sensor, and a signal level sensor for providing a DC-signal indicating the amplitude of the output signal at the variable gain power amplifier. In such embodiments, the look-up table may be made multi-dimensional so as to reflect characteristics of the transmitter chain at different temperatures, different battery voltages, and different amplitudes of the RF output signal. In still another dimension, the look-up table may reflect characteristics of the transmitter chain at different frequencies.

In an embodiment, the look-up table may also contain phase characteristic data for an RF filter comprised in the transmitter chain, or for other components comprised in the transmitter chain.

BRIEF DESCRIPTION OF THE DRAWING

Throughout the figures the same reference numerals are used for the same features.

DESCRIPTION OF THE DETAILED EMBODIMENTS

Figure 1:
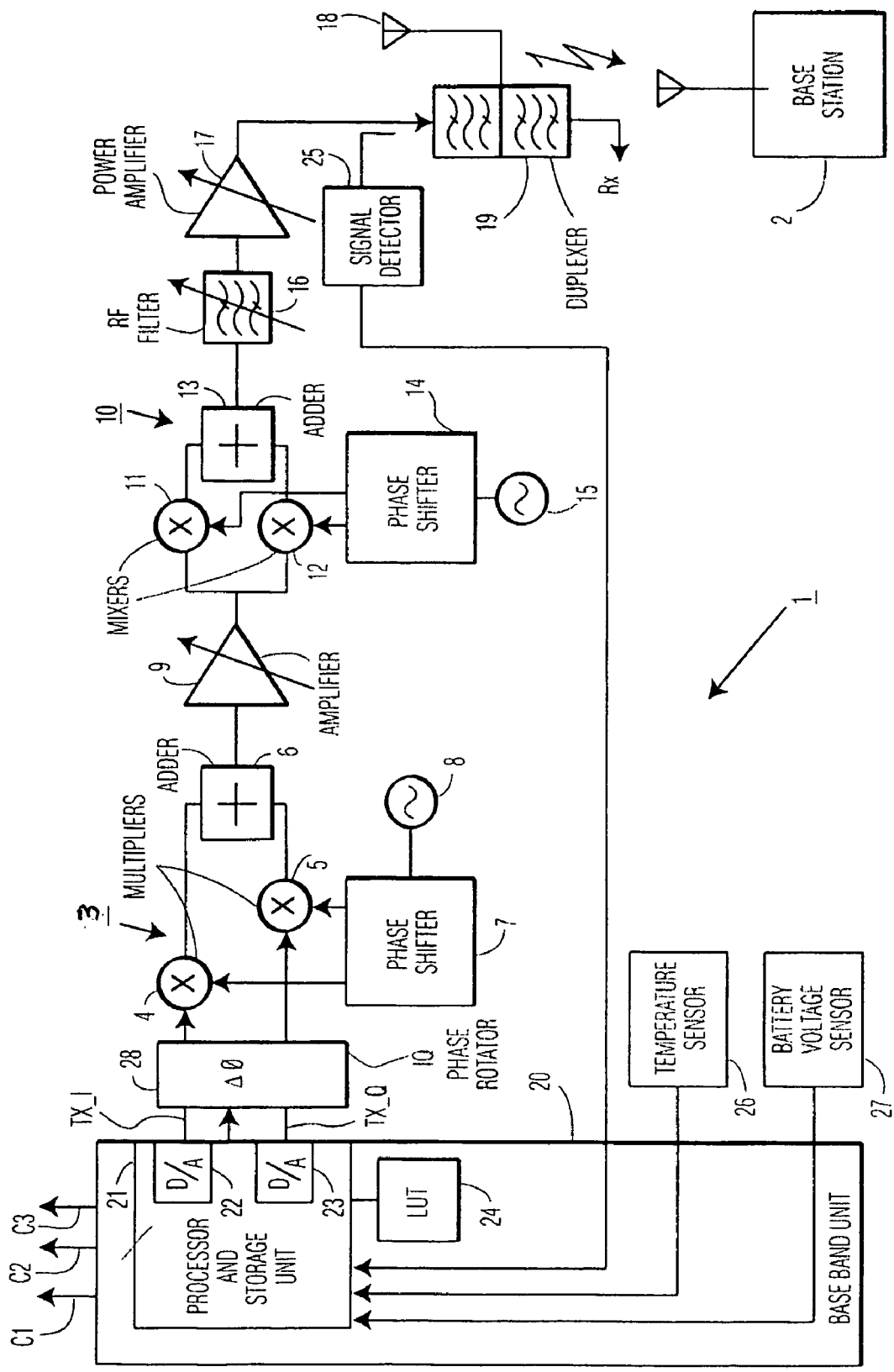
FIG. 1 shows an embodiment of a transmitter according to the invention, in communication with a base station.

FIG. 1 shows an embodiment of transmitter 1 according to the invention, in communication with a base station 2. Transmitter 1 comprises a quadrature modulator 3 comprised of multipliers 4 and 5, an adder 6, a quadrature phase shifter 7 and an oscillator 8. Quadrature modulator 3 modulates a pair of quadrature base band signals Tx_I and Tx_Q. Transmitter 1 further comprises a variable gain amplifier 9 for amplifying an intermediate frequency output signal from quadrature modulator 3, and an up-converter 10 comprised of mixers 11 and 12, an adder 13, a phase shifter 14 and an oscillator 15. Up-converter 10 provides a radio frequency signal to an RF filter 16. Transmitter 1 further comprises a variable gain amplifier 17 that is coupled to an antenna 18 via a duplexer 19. Duplexer 19 is configured such that a communication device comprising transmitter 1 and further a receiver Rx (not shown in detail here) operates in a full-duplex mode. Transmitter 1 further comprises a base band unit 20 comprising a processor and storage unit 21, digital-to-analog converters 23 and a memory 24 comprising a look-up table (LUT) according to the invention. Base band unit 20 provides control signals C1, C2 and C3 to at least control the gain of variable gain amplifier 9 and variable gain power amplifier 17. In an embodiment, transmitter 1 comprises an RF signal level detector 25 that produces a DC output signal indicative of the amplitude of the transmitted RF signal, a temperature sensor 26, and a battery voltage sensor 27. From information comprised in look-up table 24, processor unit 21 calculates the required phase change and controls a quadrature phase rotator 28 such that the IQ-constellation is rotated. In the embodiment given, modulator 3 is implemented in hardware.

Figure 2:
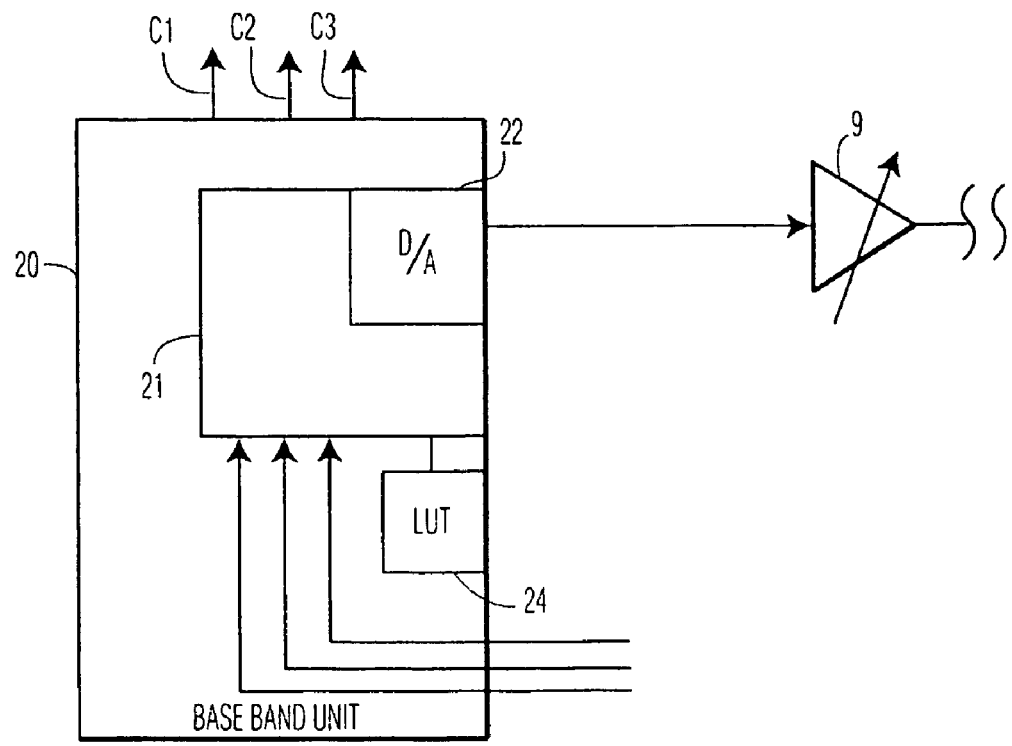
FIG. 2 shows another embodiment of a transmitter according to the invention.

FIG. 2 shows another embodiment of transmitter 1 according to the invention. In this embodiment, modulator 3 is implemented in software and processor unit is programmed accordingly. Such programming is straightforward once the functionality of the modulator is specified. The programmed modulator has the same functionality as modulator 3. Also phase rotation prior to modulation is implemented in software here.

Figure 3:
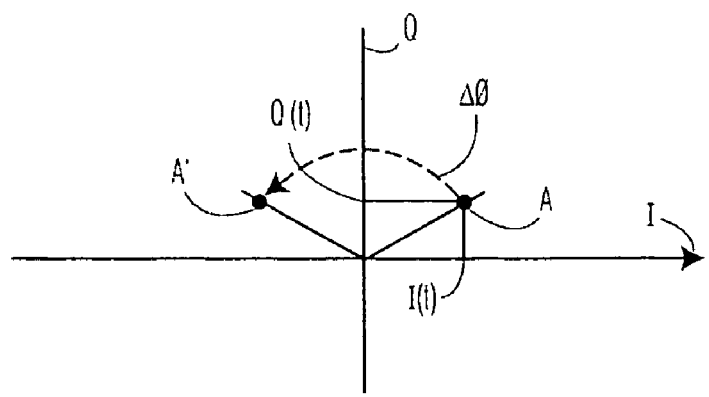
FIG. 3 shows rotation of an IQ-constellation at constant signal amplitude.

FIG. 3 shows rotation of an IQ-constellation at constant signal amplitude. In a first state, the transmitted RF signal at the output of variable gain power amplifier 17 has amplitude A and has instantaneous in-phase and quadrature components I(t) and Q(t), t being time. In a second state, the transmitted RF signal has amplitude A'=A but with a different phase. In the first and second states the overall gain of the transmitter chain is constant, but the gains of variable gain amplifier 9 and variable gain power amplifier 17 are different. The first state represents high output power at the output of variable gain power amplifier 17, and the second state represents low output power at the output of variable gain power amplifier 17. According to the invention, phase variation $\Delta\Phi$ caused by gain changes is compensated through rotation of the IQ-constellation over $\Delta\Phi$ in the opposite direction, so that, ideally, the second state becomes the same as the first state. Because in the second state variable gain power amplifier 17 operates at reduced power, overall transmitter efficiency has improved. Because standards allow predetermined phase variations, compensation does not have to be full compensation. Effects of aging or the like may be analyzed at a design stage of transmitter 1, e.g. through simulation. From such simulations it can be established that over the lifetime of transmitter 1 phase variations through aging will remain within the specifications as of such standards.

Figure 4:
FIG. 4 shows a look-up table according to the invention.

FIG. 4 shows look-up table 24 according to the invention. Look-up table 24 contains entries at gain states variable gain power amplifier 17, for variable gain power amplifier 17, for variable gain amplifier 9, and for RF band pass filter 16. Shown are respective gains $G1_{PA}$, $G1_{VGA}$, and $G1_{BPF}$, and respective phases $\Phi1_{PA}$, $\Phi1_{VGA}$, and $\Phi1_{BPF}$ at STATE 1 for variable gain power amplifier 17, for variable gain amplifier 9, and for RF band pass filter 16. Similarly, at STATE 2 respective gains $G2_{PA}$, $G2_{VGA}$, and $G2_{BPF}$, and phases $\Phi2_{PA}$, $\Phi2_{VGA}$, and $\Phi2_{BPF}$ are shown, and at STATE n respective gains $Gn_{PA}$, $Gn_{VGA}$, and $Gn_{BPF}$, and phases $\Phi n_{PA}$, $\Phi n_{VGA}$, and $\Phi n_{BPF}$. With transmitter state change from state 1 to state 2, the gain of variable gain power amplifier 9 becomes $(G1_{VGA} \times G1_{PA})/G2_{PA}$ so that the overall transmitter gain remains constant, and $\Delta\Phi$ becomes $\Sigma\Phi2_i - \Sigma\Phi1_i$, $\Sigma$ being a summing operator and i being a running variable of all phases in a particular entry of look-up table 24. Further indicated in look-up table are 'TEMP', 'BATTERY VOLTAGE', and 'FREQUENCY', indication that lookup table may be multi-dimensional in temperature, battery voltage, and frequency.

The data may be put in look-up table 24 at a manufacturing stage, and may be acquired from simulations, from measurements with a vector analyzer, from information from design engineers, or the like. Because no full phase compensation is needed in practice, such data may be acquired for an exemplary transmitter without the need to perform measurements for each and every transmitter, at least no extensive measurements going far beyond usual testing of ICs. Even with process spread, specifications may then be well within requirements set by standards.

Figure 5:
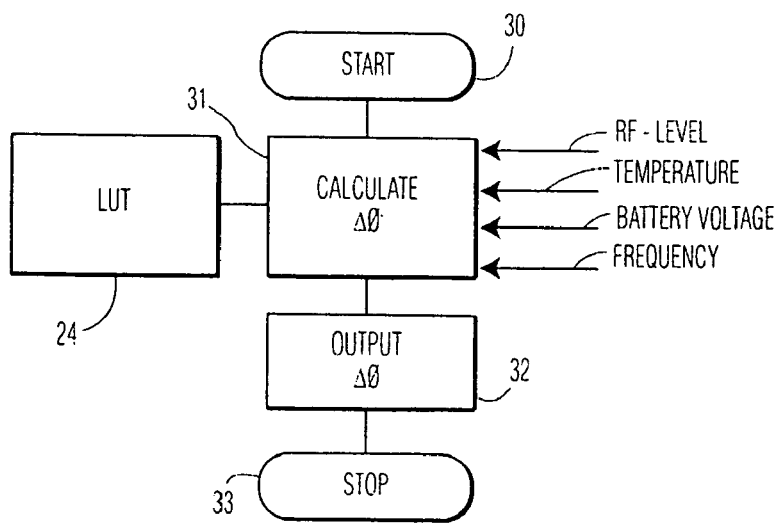
FIG. 5 shows a flow-chart illustrating calculation of a phase adjustment value according to the invention.

FIG. 5 shows a flow-chart illustrating calculation of phase adjustment value $\Delta\Phi$ according to the invention. In block 30, calculation starts, In block 31, processor 21 calculates $\Delta\Phi$ thereby using input variables 'RF-LEVEL', 'TEMPERATURE', 'BATTERY VOLTAGE', and 'FREQUENCY'. In block 32, processor 21 outputs the calculated $\Delta\Phi$, and in block 33 phase compensation stops.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A transmitter comprising:
    a quadrature modulator adapted to provide a quadrature modulated signal from a pair of quadrature base band signals;
    a variable gain amplifier adapted to provide an amplified quadrature modulated signal;
    an up-converter adapted to up-convert said amplified quadrature modulated signal to a higher frequency signal;
    a variable gain power amplifier adapted to provide an amplified higher frequency signal from said higher frequency signal, said amplified higher frequency signal comprising amplitude and phase information; and
    phase adjusting means for adjusting an overall phase of a transmitter chain including said quadrature modulator, said variable gain amplifier, said up-converter, and said variable gain power amplifier, said overall phase being adjusted on the basis of pre-stored phase information reflecting phase changes due to simultaneous gain changes of gains of at least said variable gain amplifier and said variable gain power amplifier, wherein said phase changes will not exceed a predetermined value, said phase adjusting means being configured to keep said phase changes below said predetermined value.

2. A transmitter as claimed in claim 1, wherein said transmitter is configured to operate according to a given standard.

3. A transmitter as claimed in claim 1, wherein said transmitter chain has an overall substantially constant gain.

4. A transmitter as claimed in claim 1 wherein said phase adjusting means comprises a processor and said pre-stored phase information is stored in a lookup table, said processor being configured to calculate a phase adjustment value for said overall phase from gain and phase information at entries in said look-up table upon a gain change of said gain of said variable gain power amplifier.

5. A transmitter as claimed in claim 4, wherein said phase adjusting means is a base band quadrature phase rotator rotating said quadrature base band signal prior to modulation.

6. A transmitter as claimed in claim 4, wherein said transmitter further comprises a temperature sensor providing a temperature value, said look-up table comprises said pre-stored phase information for different temperatures, and said processor also calculates said phase adjustment value on the basis of said temperature value.

7. A transmitter as claimed in claim 4, wherein said transmitter further comprises a battery voltage sensor providing a battery voltage value, said look-up table comprises said pre-stored phase information for different battery voltages, and said processor also calculates said phase adjustment value on the basis of said battery voltage value.

8. A phase adjuster for a transmitter comprising a transmitter chain including a quadrature modulator, a variable gain amplifier coupled to said quadrature modulator, an up-converter coupled to said variable gain amplifier, and a variable gain power amplifier coupled to said up-converter, said phase adjuster being arranged for adjusting an overall phase of said transmitter chain on the basis of pre-stored phase information reflecting phase changes due to simultaneous gain changes of gains of at least said variable gain amplifier and said variable gain power amplifier, wherein said phase changes will not exceed a predetermined value, said phase adjusting means being configured to keep said phase changes below said predetermined value.

9. A phase adjuster as claimed in claim 8, for a transmitter that is configured to operate according to a given standard.

10. A phase adjuster claimed in claim 8, further comprising a processor, and a look-up table, said pre-stored pre-stored phase information is stored in said lookup table, said processor being configured to calculate a phase adjustment value for said overall phase from gain and phase information at entries in said look-up table upon a gain change of said gain of said variable gain power amplifier.

11. A method of adjusting an overall phase of a transmitter chain including a quadrature modulator, a variable gain amplifier coupled to said quadrature modulator, an up-converter coupled to said variable gain amplifier, and a variable gain power amplifier coupled to said up-converter, said method comprising:
adjusting an overall phase of said transmitter chain on the basis of pre-stored phase information reflecting phase changes due to simultaneous gain changes of gains of at least said variable gain amplifier and said variable gain power amplifier, wherein said phase changes will not exceed a predetermined value, said phase adjusting means being configured to keep said phase changes below said predetermined value.

12. A method as claimed in claim 11, wherein said transmitter chain further comprises a variable gain band pass filter that is arranged between said up-converter and said variable gain power amplifier, said method further comprising adjusting said over all phase by taking into account gain changes of said variable gain band pass filter.

13. A method as claimed in claim 11, further taking into account frequency changes in a higher frequency signal provided by said variable gain power amplifier.

14. A communication device including a transmitter, said transmitter comprising:
a quadrature modulator adapted to provide a quadrature modulated signal from a pair of quadrature base band signals;
a variable gain amplifier adapted to provide an amplified quadrature modulated signal;
an up-converter adapted to up-convert said amplified quadrature modulated signal to a higher frequency signal;
a variable gain power amplifier adapted to provide an amplified higher frequency signal from said higher frequency signal, said amplified higher frequency signal comprising amplitude and phase information; and
phase adjusting means for adjusting an overall phase of a transmitter chain including said quadrature modulator, said variable gain amplifier, said up-converter, and said variable gain power amplifier, said overall phase being adjusted on the basis of pre-stored phase information reflecting phase changes due to simultaneous gain changes of gains of at least said variable gain amplifier and said variable gain power amplifier, wherein said phase changes will not exceed a predetermined value, said phase adjusting means being configured to keep said phase changes below said predetermined value.

15. A communication device as claimed in claim 14 wherein said phase adjusting means comprises a processor and said pre-stored phase information is stored in a lookup table, said processor being configured to calculate a phase adjustment value for said overall phase from gain and phase information at entries in said look-up table upon a gain change of said gain of said variable gain power amplifier.

16. A communication device as claimed in claim 14, wherein said transmitter is configured to operate according to a given standard.

17. A communication device as claimed in claim 16, wherein said phase adjusting means is a base band quadrature phase rotator rotating said quadrature base band signal prior to modulation.

18. A communication device as claimed in claim 16, wherein said processor comprises a processor and storage unit.

19. A communication device as claimed in claim 15, wherein said transmitter further comprises a temperature sensor providing a temperature value, said look-up table comprises said pre-stored phase information for different temperatures, and said processor also calculates said phase adjustment value on the basis of said temperature value.

20. A communication device as claimed in claim 15, wherein said transmitter further comprises a battery voltage sensor providing a battery voltage value, said look-up table comprises said pre-stored phase information for different battery voltages, and said processor also calculates said phase adjustment value on the basis of said battery voltage value.

* * * * *